(12) United States Patent
Naumann (10) Patent No.: US 9,612,254 B2
(45) Date of Patent: Apr. 4, 2017

(54) MICROELECTROMECHANICAL SYSTEMS DEVICES WITH IMPROVED LATERAL SENSITIVITY

(71) Applicant: Freescale Semiconductor, Inc., Austin, TX (US)

(72) Inventor: Michael Naumann, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 206 days.

(21) Appl. No.: 14/318,199

(22) Filed: Jun. 27, 2014

(65) Prior Publication Data

US 2015/0375989 A1 Dec. 31, 2015

(51) Int. Cl.
*G01P 15/125* (2006.01)
*B81B 7/00* (2006.01)
*B81C 1/00* (2006.01)
*G01P 15/08* (2006.01)

(52) U.S. Cl.
CPC ............ *G01P 15/125* (2013.01); *B81B 7/007* (2013.01); *B81C 1/00365* (2013.01); *B81B 2207/095* (2013.01); *B81C 2201/0197* (2013.01); *B81C 2203/0136* (2013.01); *G01P 2015/0814* (2013.01)

(58) Field of Classification Search
CPC .. G01P 15/125; G01P 2015/0814; B81B 7/00; B81B 7/007; B81B 2207/095; B81C 1/00365; B81C 2201/0197; B81C 2203/0136
See application file for complete search history.

(56) References Cited

U.S. PATENT DOCUMENTS

| | | | | |
|---|---|---|---|---|
| 2006/0096377 A1* | 5/2006 | Gogoi | ................. | B81C 1/00936 73/514.16 |
| 2006/0144143 A1* | 7/2006 | Gogoi | .................. | B81B 3/0051 73/504.12 |
| 2010/0058864 A1* | 3/2010 | Hsu | ........................ | G01P 15/125 73/514.32 |
| 2011/0049653 A1* | 3/2011 | Kanemoto | .......... | G01P 15/0802 257/417 |
| 2012/0297873 A1* | 11/2012 | Zou | ....................... | G01P 15/125 73/504.12 |
| 2013/0319076 A1* | 12/2013 | Moreau | ............... | B81C 1/00968 73/1.38 |
| 2014/0144231 A1 | 5/2014 | Lin et al. | | |
| 2014/0245832 A1* | 9/2014 | Lin | ...................... | G01P 15/125 73/514.35 |

(Continued)

OTHER PUBLICATIONS

"Small, Low Power, 3-Axis ±3g iMEMS Accelerometer ADXL330," Analog Devices, Inc., 2007 (16 pages).

(Continued)

*Primary Examiner* — Nguyen Ha (57) ABSTRACT

Microelectromechanical system (MEMS) devices and methods for forming MEMS devices are provided. The MEMS devices include a substrate, an anchored structure fixedly coupled to the substrate, and a movable structure resiliently coupled to the substrate. The movable structure has an opening formed therethrough and is positioned such that the anchored structure is at least partially within the opening and is in a capacitor-forming relationship with the movable structure. The movable structure comprises a movable structure finger extending only partially across the opening.

11 Claims, 7 Drawing Sheets

(56) References Cited

U.S. PATENT DOCUMENTS

| | | | |
|---|---|---|---|
| 2014/0284603 A1* | 9/2014 | Su | B81B 3/0008 |
| | | | 257/49 |
| 2015/0082885 A1* | 3/2015 | Rinkio | G01C 19/5712 |
| | | | 73/504.12 |
| 2015/0122024 A1* | 5/2015 | Clark | G01P 15/125 |
| | | | 73/514.32 |
| 2015/0301075 A1* | 10/2015 | Yamanaka | G01P 15/125 |
| | | | 73/1.38 |

OTHER PUBLICATIONS

"LISY300AL MEMS inertial sensor: single-axis ±300°/s analog output yaw rate gyroscope," STMicroelectronics, May 2008 (13 pages).

"LIS331DLH MEMS digital output motion sensor ultra low-power high performance 3-axes "nano" accelerometer," STMicroelectronics, Jul. 2009 (38 pages).

"BMA250 Digital, triaxial acceleration sensor," Bosch Sensortec, May 31, 2012 (74 pages).

"Ultra-Accurate, Low Power, 3-Axis Digital Output Gyroscope," Maxim Integrated Products, Inc., 2013 (26 pages).

\* cited by examiner

MICROELECTROMECHANICAL SYSTEMS DEVICES WITH IMPROVED LATERAL SENSITIVITY

TECHNICAL FIELD OF THE INVENTION

The present invention relates generally to microelectromechanical systems (MEMS) devices. More specifically, the present invention relates to MEMS devices, such as accelerometers and gyroscopes, with improved lateral sensitivity and methods for forming such devices.

BACKGROUND OF THE INVENTION

Microelectromechanical systems (MEMS) technology provides a way to make very small mechanical structures and integrate these structures with electrical devices on a single substrate using conventional batch semiconductor processing techniques. One common application of MEMS is the design and manufacture of sensor devices. MEMS sensors are used in a wide variety of applications such as automotive, inertial guidance systems, household appliances, game devices, protection systems, and many other industrial, scientific, and engineering systems.

One example of a MEMS sensor is an accelerometer. MEMS accelerometers are sensitive to acceleration or acceleration forces. These forces may be static, like the constant force of gravity, or they can be dynamic, caused by moving or vibrating the sensor. Accelerometers may sense acceleration forces along one, two, or three axes or directions. From this information, the movement or orientation of the device in which the accelerometer is installed can be ascertained.

Commonly, MEMS accelerometers react to acceleration with a change in electrical capacitance, which causes the output of an energized circuit, connected to the sensor, to vary. One common form of MEMS accelerometer uses one or more structures that move under acceleration above a substrate. The movement of the movable structure changes capacitance, and the electrical circuit connected to the MEMS accelerometer structure measures the change in capacitance to determine the acceleration forces. Such MEMS accelerometers are widely used in a variety of sensing applications. For example, vehicle or automotive applications may use MEMS accelerometers to determine when to deploy the vehicle airbag or activate a stability and/or fraction control system. In addition, consumer electronics devices, such as video game controllers, personal media players, cell phones, and digital cameras, also use MEMS accelerometers in various applications to detect the orientation and/or respond to movement of the device.

As these devices continue to shrink in size, it becomes increasingly difficult to provide the desired sensitivity. Additionally, when the MEMS accelerometers are designed in such a way to maximize sensitivity, mechanical issues may arise which lead to deformation induced contacts between the components (e.g., the movable structure) of the device.

BRIEF DESCRIPTION OF THE DRAWINGS

A more complete understanding of the present invention may be derived by referring to the detailed description and claims when considered in connection with the Figures. It should be noted that these figures are not necessarily drawn to scale, and that in these figures like reference numbers refer to similar items throughout the Figures, and:

DETAILED DESCRIPTION

The various embodiments described herein provide MEMS devices, such as MEMS accelerometers and/or transducers, with improved lateral sensitivity and methods for forming such MEMS devices. In some embodiments, the MEMS device includes at least one anchored structure and a movable structure formed above a substrate. The movable structure has an opening therein in which the at least one anchored structure is positioned such that the movable structure laterally surrounds, and is in a capacitor-forming relationship with, the at least one anchored structure. The movable structure (and/or the at least one anchored structure) includes additional sense electrodes (or electrode portions) or "fingers" in regions of the device which are not conventionally utilized, and which only partially extend across the opening. These additional fingers improve the sensitivity of the device by increasing capacitance or, in some embodiments, allow the mechanical rigidity of the device to be improved for a given, usable area on the substrate.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

In general, MEMS accelerometers sense a change in, for example, electrical capacitance, with respect to acceleration. One common form of MEMS accelerometer uses a sensing transducer with a movable element (or structure) that moves under acceleration above a reference substrate. The movement of the movable element changes capacitance, and the MEMS accelerometer structure measures the change in capacitance to determine the acceleration forces.

When the reference substrate experiences a force that generates a change in acceleration, the sense electrodes detect a change in capacitance caused by oscillation (or movement) of a sense mass (i.e., the movable structure). In this way, the sensing transducer of the MEMS accelerometer can provide a measure of acceleration forces. However, it should be understood that the transducers described below may be used in other MEMS devices, such as gyroscopes and other lateral sensing devices, and other electrical properties, such as resistance may also be used.

Figure 1:
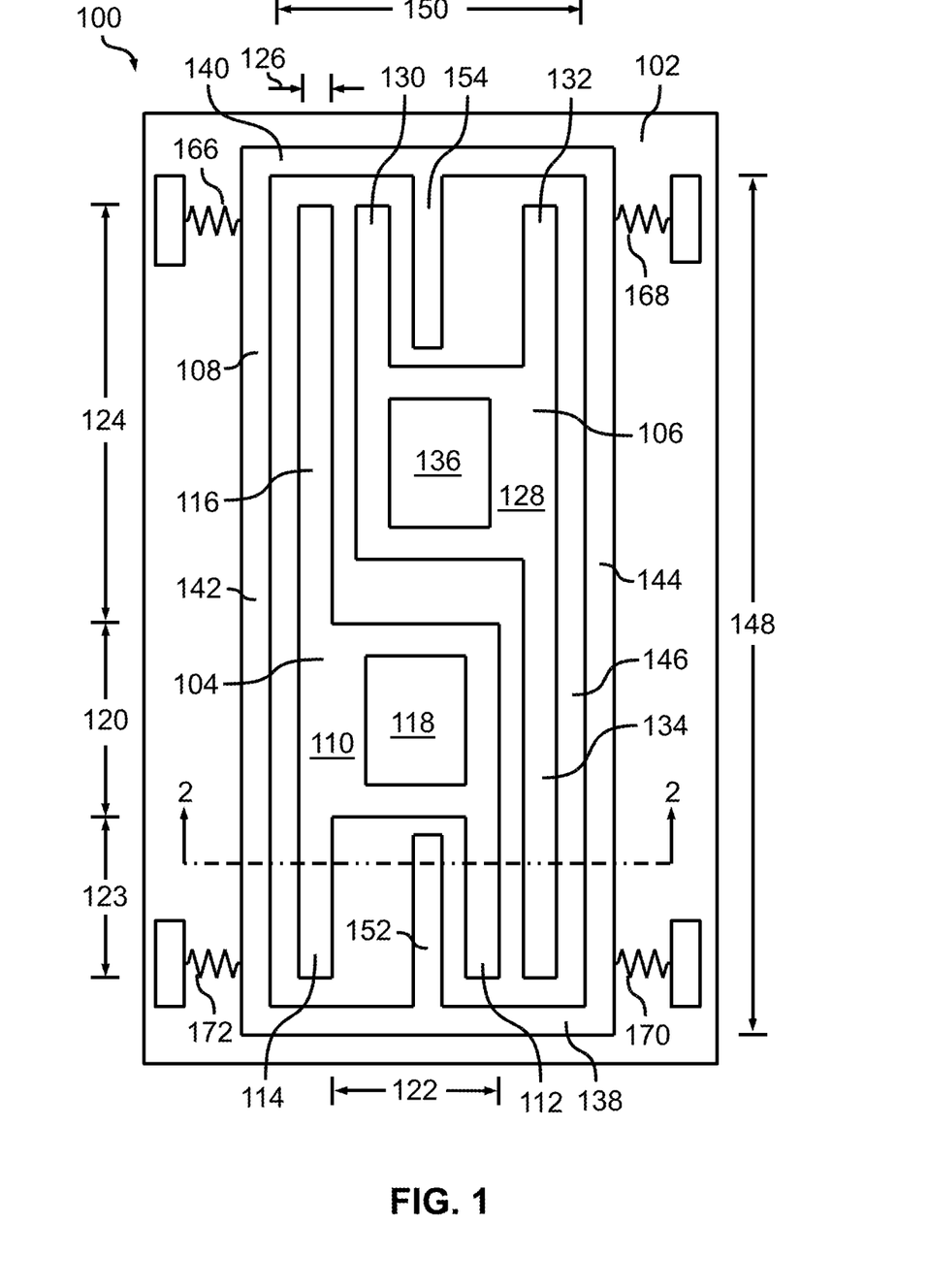
FIG. 1 is a schematic view of a MEMS device according to some embodiments.

Turning now to FIG. 1, a simplified schematic view of a MEMS accelerometer transducer 100, according to an embodiment of the present invention, is illustrated. The transducer 100 is formed on a substrate 102 and includes a first anchored structure 104, a second anchored structure 106, and a movable structure 108. The substrate 102 may be any body made of a material over which the first and second anchored structures 104 and 106 and the movable structure 108 may be fabricated, such as silicon (e.g., polycrystalline silicon), glass, quartz, and the like.

The first anchored structure 104 includes a main body 110 and fingers (or anchored fingers, or particularly, anchored structure fingers,) 112, 114, and 116 extending from the main body 110. The main body 110 includes an anchored portion 118 that, as described in greater detail below, is coupled (or connected) to the substrate 102 in a fixed manner. In some embodiments, the main body 110 has a length 120 of, for example, between about 10 and 20 micrometers (μm) and a width 122 of, for example, between about 5 and 15 μm.

Fingers 112 and 114 extend from respective corners of main body 110 in the manner shown in FIG. 1. The term "finger" is utilized herein to indicate that the structures (e.g., 112 and 114) often assume the form of elongated, beam-like plates or structures. However, the term "finger" is defined to include any electrically conductive structure or electrode (e.g., made of polycrystalline silicon), which can be interspersed with or otherwise positioned in a capacitor-forming relation ship with other electrically-conductive structures (e.g., other fingers) to produce a capacitive-sensing MEMS device of the type described herein.

Still referring to FIG. 1, each of the fingers 112 and 114 has a length 123 of, for example, between about 5 and 25 μm (e.g., 5-25 μm), or greater. Finger 116 extends from a corner of main body 110 on a side opposite fingers 112 and 114 and has a length 124 of, for example, between about 25 and 50 μm (e.g., 25-35 μm), or greater. Each of the fingers 112, 114, and 116 has a width 126 of, for example, between about 1 and 3 μm (e.g., 2 μm). As shown in FIG. 1, fingers 112, 114, and 116 extend from the main body 110 in substantially parallel directions. Additionally, although fingers 114 and 116 have been described as separate fingers, it should be understood that in some embodiments, fingers 114 and 116 may be considered to be a single finger connected to a side of main body 110 with a length of, for example, between about 45 and 70 μm, or greater.

The second anchored structure 106 includes a main body 128 and fingers 130, 132, and 134 extending from the main body 110. The main body 128 includes an anchored portion 136, which similar to that of the main body 110 of the first anchored structure 104, is connected to the substrate in a fixed manner. As is apparent in FIG. 1, the main body 128 and fingers 130, 132, and 134 of the second anchored structure 106 are similar in size and shape to the similarly named components of the first anchored structure 104 such that the second anchored structure 106 is substantially identical to the first anchored structure 104. However, the second anchored structure 106 is arranged on the substrate 102 in an angular orientation that is rotated 180 degrees when compared to the first anchored structure 104 and is positioned such that the overall combined shape of the first and second anchored structures 104 and 106 is substantially that of a rectangle (or more particularly, the overall area occupied by the first and second anchored structures, or the "footprint," is substantially in the shape of a rectangle).

Still referring to FIG. 1, in the depicted embodiment, the movable structure 108 includes four segments (or portions) 138, 140, 142, and 144, each of which is substantially linear (or rectangular) in shape, connected in such a manner to form an opening 146. In some embodiments, the segments 138, 140, 142, and 144 of the movable structure 108 are sized such that the opening 146 has a length 148 of, for example, between about 50 and 80 μm and a width 150 of, for example, between about 15 and 25 μm.

The movable structure 108 also includes fingers (or movable fingers, or more particularly, movable structure fingers) 152 and 154 which are connected to (and/or extend from) segments 138 and 140, respectively, and extend into the opening 146. Fingers 152 and 154 may have lengths similar to those of fingers 112, 114, 130, and 132 of the first and second anchored structures 104 and 106. It should be noted that fingers 152 and 154 only partially extend across the opening 146 (and/or do not completely extend across the opening 146).

Segments 138, 140, 142, and 144, as well as fingers 152 and 154, may have widths similar to width of the various fingers of the first and second anchored structures 104 and 106 (e.g., width 126), such as about 2 μm.

Figure 2:
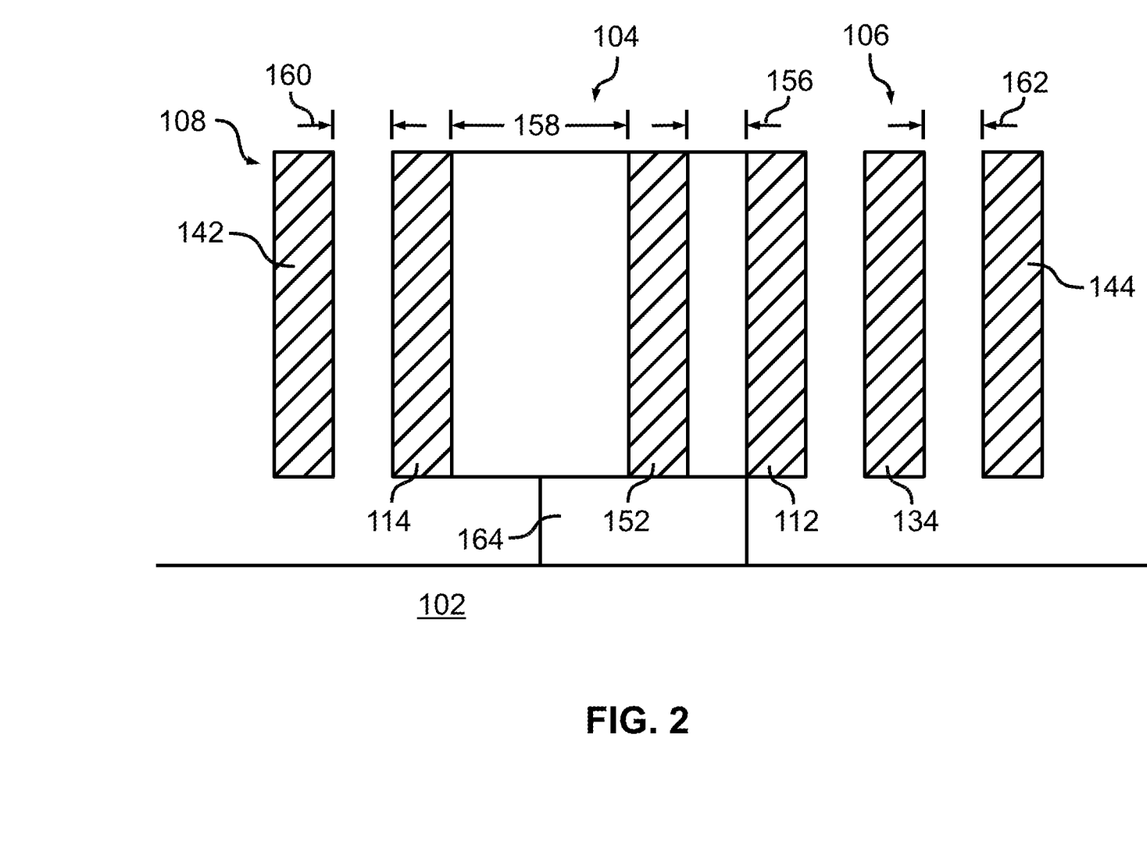
FIG. 2 is a cross-sectional view of the MEMS device of FIG. 1 taken along line 2-2.

Referring now to FIG. 2 in combination with FIG. 1, the movable structure 108 is positioned such that the first and second anchored structures 104 and 106 are located within the opening 146. As such, in some embodiments, the movable structure 108 laterally surrounds the first and second anchored structures 104 and 106. That is, in some embodiments, the movable structure 108 extends around a periphery of the first and second anchored structures 104 and 106 and has substantially the same vertical profile (e.g., relative to the substrate 102) as the first and second anchored structures 104 and 106 (or at least the fingers thereof). As is evident in FIG. 1, the movable structure 108 does not contact (at least not directly) either of the first and second anchored structures 104 and 106 such that a continuous gap lies between the anchored structures 104 and 106 and the movable structure 108 (i.e., the anchored structures 104 and 106 are electrically isolated from the movable structure 108).

Referring specifically to FIG. 2, in some embodiments, a distance 156 (or the width of a gap) between finger 112 of the first anchored structure 104 and finger 152 of the movable structure 108 is, for example, between about 1 and 5 μm, such as about 1.5 μm, and a distance 158 between finger 114 of the first anchored structure 104 and finger 152 of the movable structure 108 is, for example, between about 2 and 20 μm, such as about 4.5 μm. Thus, in some embodiments, a ratio of distance 156 to distance 158 is between about 1:2 and about 1:4, which is discussed in greater detail below. A distance 160 between segment 142 of the movable structure 108, as well as a distance 162 between segment 144 of the movable structure 108, may be, for example, between about 1 and 5 μm. Although FIG. 2 only shows portions of anchored structure 104 and its positional relationship to the movable structure 108, it should be understood that the various portions (e.g., fingers) of anchored structure 106 may be similarly sized and shape and be in a similar positional relationship with the movable structure 108.

Still referring to FIG. 2, in some embodiments, the fingers (e.g., fingers 112, 114, 134, and 152), as well as the segments of the movable structure 108 (e.g., segments 142 and 144) are advantageously fabricated to have a high aspect ratio. A high aspect ratio provides an increase in surface area between the fingers and the segments, therefore, a larger sense capacitance and an increased signal-to-noise ratio. For example, in one embodiment, the height-to-width ratio of the fingers and the segments may be about 12:1 (e.g., the various fingers and segments may have a height/thickness of about 25 μm). Using such a high aspect ratio on the movable structure 108 may also reduce thermal noise (e.g., because of reduced ohmic resistance). The foregoing not withstanding, it is emphasized that the particular dimensions and geometries of fingers and segments may vary amongst different embodiments of MEMS accelerometer transducer 100, as will the dimensions and geometries of the other structural features included within the transducer 100.

The height, or thickness, of the fingers and segments of the transducer 100 may depend on the thickness of a "structural layer" (e.g., made of polycrystalline silicon) above the substrate 102, from which the anchored structures 104 and 106 and the movable structure 108 are formed (e.g., via lithography and etching processes, as are commonly understood). In some embodiments, the transducer 100 is formed utilizing a "MEMS process flow," wherein a structural layer is first formed over the substrate 102 followed by the formation of an interconnect layer (not shown). As such, it should be understood that the transducer may also include one more traces, interconnect lines, conductive vias, etc. for making electrical connections to the anchored structures 104 and the movable structure 108. It should also be understood that other processes, such as "CMOS MEMS" used to fabricated transistors and other semiconductor devices, may also be used.

Referring to FIGS. 1 and 2, the first anchored structure 104 is connected to the substrate 102 via an anchor (or anchor structure) 164 that corresponds to the anchored portion 118 of the main body 110 of the first anchored structure. Although not specifically shown, it should be understood that a similar anchor structure, corresponding to the anchored portion 136 of the main body 128 of the second anchored structure 106, may connect the second anchored structure 106 to the substrate 102.

Referring now to FIG. 1, the movable structure 108 is connected to the substrate through translatory springs 166, 168, 170, and 172. Although shown in a simplified form in FIG. 1, one skilled in the art will appreciate that the translatory springs 166-172 may be formed by "folded," resilient members which are connected to the substrate 102 in such a way to allow the movable structure 108 to move with a "spring-like" action in at least one dimension (e.g., along the x-axis or laterally as shown in FIG. 1). In some embodiments, the springs are connected to at least one of the anchored structures 104 and 106, which are in turn fixed to the substrate 102.

Thus, the anchored structures 104 and 106 are rigidly affixed to the substrate 102 such that relative movement between the anchored structures 104 and 106 and substrate 22 is prevented. Consequently, the anchored structures 104 and 106 are essentially immovable or spatially fixed with respect to the substrate 102. In contrast, the movable structure 108 is resiliently coupled to the substrate 102 and moves with respect to both the substrate 102 and the anchored structures 104 and 106 in response to acceleration or other movement of the transducer 100.

Still referring to FIGS. 1 and 2, due to the relative positioning of the anchored structures 104 and 106 and the movable structure 108 described above, various portions of the anchored structures 104 and 106 are in capacitor-forming relationships with various portions of the movable structure 108. For example, finger 152 of the movable structure 108 is in a capacitor-forming relationship with finger 112, as well as finger 114, of anchored structure 104, while finger 154 of the movable structure 108 is in a capacitor-forming relationship with finger 130 (and finger 132) of anchored structure 106. Additionally, segment 142 of the movable structure 108 is in a capacitor-forming relationship with fingers 114 and 116, as well as the main body 110, of anchored structure 104. Similarly, segment 144 of the movable structure 108 is in a capacitor-forming relationship with fingers 132 and 134, as well as the main body 128, of anchored structure 106. As will be appreciated by one skilled in the art, when appropriate voltages are applied to the components, the resulting capacitances may be measured and/or monitored.

In use, when a sufficient force is applied to the accelerometer (e.g., a force sufficient to cause the accelerometer to undergo an acceleration), the movable structure 108 moves or oscillates relative to the anchored structures 104 and 106. The movement of the movable structure 108 causes a change in the capacitance between the various portions of the movable structure 108 and the anchored structures 104 and 106 that are in capacitor-forming relationships, as described above. The change in capacitance (or capacitance output) is converted via electronics (e.g., a processor, a memory device, etc. which may be formed on the same substrate as the transducer) into a signal having a parameter magnitude (e.g. voltage, current, frequency, etc.). The signal is dependent on the acceleration of MEMS accelerometer, and as such, may be used to determine the magnitude of the acceleration (and/or the force). In this way, the accelerometer may be used to determine a force applied to the accelerometer (and/or an acceleration associated with the force). In embodiments in which multiple transducers 100 are utilized (e.g., such as that in FIG. 6), the direction of the acceleration may also be determined.

In embodiments in which the opening 146 of the movable structure 108 has a length of 60 μm, the addition of fingers 152 and 112 may increase the capacitive sensitivity of the transducer 100 by more than 16% with respect to one of the anchored structures (e.g., anchored structure 104). That is, the capacitive sensitivity is 16% greater than similar transducers without fingers 152 and 112. In embodiments in which the opening 146 of the movable structure 108 has a length of 70 μm, the addition of fingers 152 and 112, in accordance with some embodiments of the present invention, may increase the capacitive sensitivity of the transducer 100 by more than 18% with respect to one of the anchored structures (e.g., anchored structure 104).

A further investigation of the increased sensitivity of the transducer is provided below. The standard capacitance change (i.e., the capacitance change for transducers without the additional fingers described above) may be expressed as:

$$\Delta C_0(u) := \frac{\varepsilon_0 \cdot Le \cdot t}{gap_1 - u} - \frac{\varepsilon_0 \cdot Le \cdot t}{gap_1 + u}, \tag{1}$$

where $\varepsilon_0$ is vacuum permittivity in femtofarads (fF), $gap_1$ is the "small" lateral sense gap (e.g., the distance between finger 152 and finger 112, such as 1.5 μm), t is the thickness of the structural/functional layer (e.g., 25 μm), Le is the effective electrode (or finger) length (e.g., 66 μm for transducers with openings 146 with lengths of 70 μm), and u is the considered electrode displacement range (e.g., −0.5 μm, −0.45 μm, . . . 0.5 μm).

The additional, supportive capacitance change (e.g., due to the change in distance between finger 152 and finger 112) may be expressed as:

$$\Delta Ca_1(u) := \frac{\varepsilon_0 \cdot Le_a \cdot t}{gap_1 - u} - \frac{\varepsilon_0 \cdot Le_a \cdot t}{gap_1 + u}, \tag{2}$$

where, $Le_a$ is the additional electrode length due to the additional finger(s) (e.g., 12 µm).

The additional, counteracting capacitance change (e.g., due to the change in distance between finger 152 and finger 114) may be expressed as:

$$\Delta Ca_2(u, gap_2) := \frac{\varepsilon_0 \cdot Le_a \cdot t}{gap_2 + u} - \frac{\varepsilon_0 \cdot Le_a \cdot t}{gap_2 - u}, \quad (3)$$

where $gap_2$ is the "large" lateral sense gap (e.g., the distance between finger 152 and finger 114, such as 4.5 µm).

Thus, the sum of all capacitance changes, when the additional fingers (e.g., finger 152 and finger 112) are included, may be expressed as:

$$\Delta Ca(u, gap_2) := \Delta C_0(u) + \Delta Ca_1(u) + \Delta Ca_2(u, gap_2). \quad (4)$$

Figure 3:
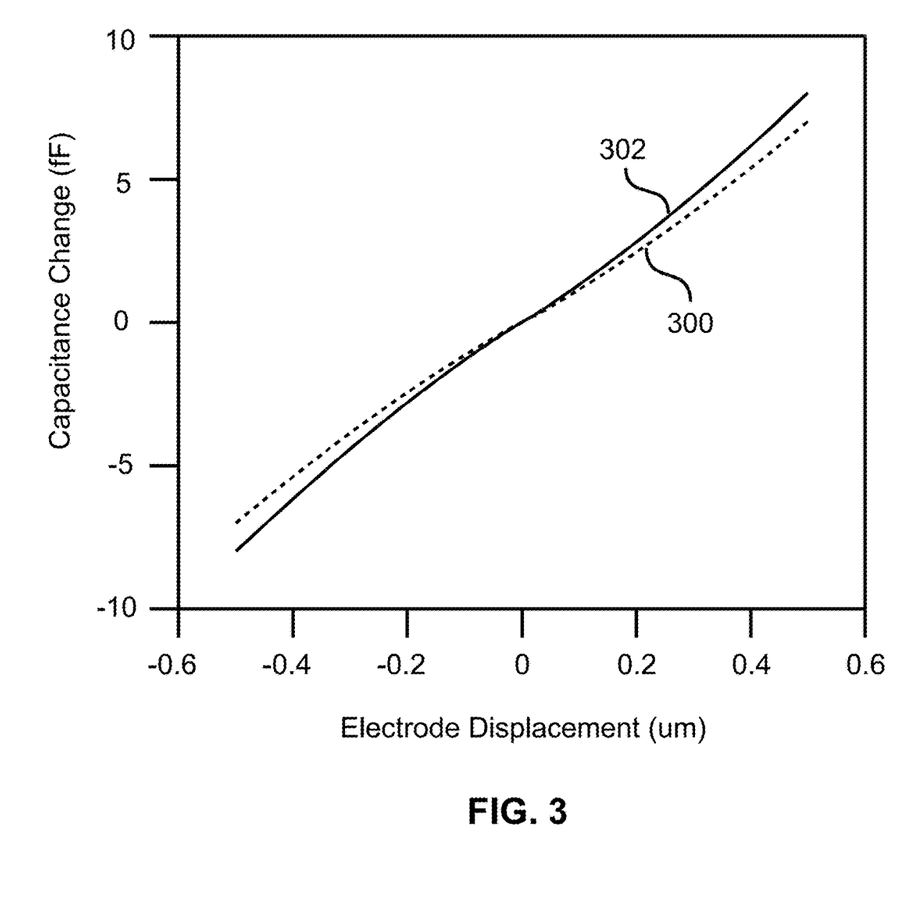
FIG. 3 is a graph comparing the capacitance change of a conventional MEMS device to one embodiment of a MEMS device described herein for various electrode displacements.

FIG. 3 is a graph illustrating the change in capacitance (fF) of a conventional transducer (e.g., without the additional fingers) compared to one embodiment of a transducer as described herein (with the additional finger(s)). It should be understood that the electrode displacement (µm) may be dictated by the equation $$u = \frac{m}{c} \cdot a, \quad (5)$$

where m is the mass of the device, c is the stiffness of the device, and a is the acceleration level.

In FIG. 3, line 300 depicts the capacitance change for a conventional transducer, and line 302 depicts the capacitance change for one embodiment of a transducer as described herein. As shown, the sensitivity of the transducer is increased with the additional fingers described above.

Figure 4:
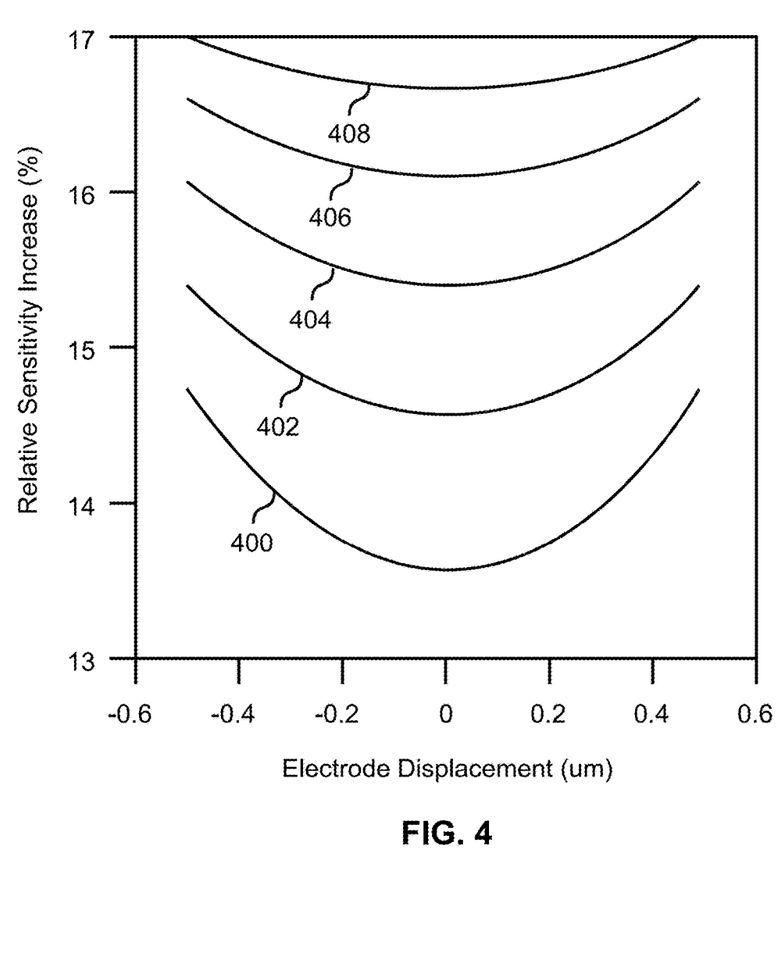
FIG. 4 is a graph depicting the relative sensitivity increase for various embodiments of MEMS devices described herein.

FIG. 4 is a graph illustrating the increase in relative sensitivity increase (%) for the transducers described herein compared to convention transducers (i.e., without the additional fingers). For each of the transducers represented by lines 400, 402, 404, 406, and 408, the small lateral sense gap (e.g., the distance between finger 152 and finger 112) is 1.5 µm, while the "large" lateral sense gap (e.g., the distance between finger 152 and finger 114) is increased from 3 µm to 5 µm. More particularly, in the transducer depicted by line 400, the small lateral sense gap is 1.5 µm and the large lateral sense gap is 3.0 µm. In the transducer depicted by line 402, the small lateral sense gap is 1.5 µm and the large lateral sense gap is 3.5 µm. In the transducer depicted by line 404, the small lateral sense gap is 1.5 µm and the large lateral sense gap is 4.0 µm. In the transducer depicted by line 406, the small lateral sense gap is 1.5 µm and the large lateral sense gap is 4.5 µm. In the transducer depicted by line 408, the small lateral sense gap is 1.5 µm and the large lateral sense gap is 5.0 µm.

As is evident in FIG. 4, regardless of the size of the small gap compared to that of the large gap (at least within the range shown), the sensitivity of the transducers described herein may be higher than that of conventional transducers, regardless of electrode (or finger) displacement (µm). Moreover, the sensitivity of the transducer increases as the ratio of the size of the small lateral sense gap to the size of the large lateral sense gap decreases (i.e., as the size of the large lateral sense gaps increases relative to the size of the small lateral sense gap).

However, it should be noted that increasing the size of the large lateral sense gap relative to the size of the small lateral sense gap also results in an increase in the overall size (or "footprint") of the transducers described herein. In some embodiments, such as when the size of the small lateral sense gap is between 1 and 5 µm, the ratio of the size of the small lateral sense gap to the size of the large lateral sense gap is between about 1:2 and about 1:4, as is represents a preferred combination of sensitivity and overall device size.

Figure 5:
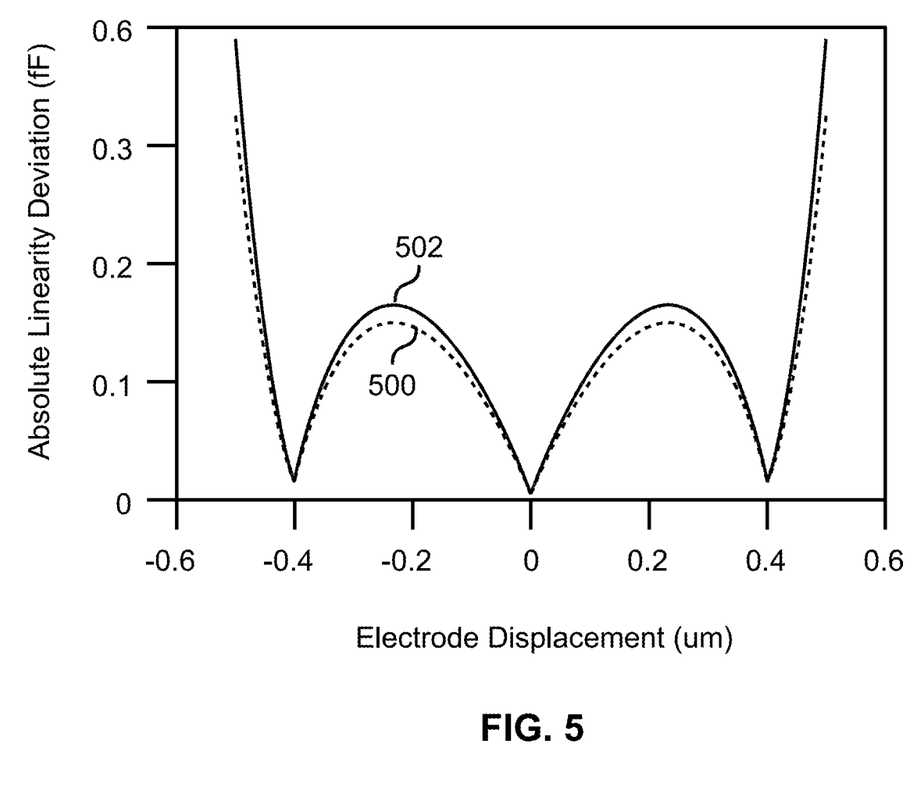
FIG. 5 is graph comparing the absolute linearity deviation of a conventional MEMS device to one embodiment of a MEMS device described herein for various electrode displacements.

FIG. 5 is a graph illustrating a comparison of the absolute linearity deviation (fF) of the transducers described herein compared to that of conventional transducers. More particularly, line 500 depicts the absolute linearity deviation for conventional transducers, and line 502 depicts the absolute linearity deviation of the transducers described herein. As is evident in FIG. 5, the transducers described herein may demonstrate a slightly higher absolute linearity deviation, regardless of electrode displacement (µm). However, when the additional sensitivity is taken into account (i.e., relative linearity deviation), the linearity deviation for the transducers described herein is nearly identical to that of conventional designs.

Figure 6:
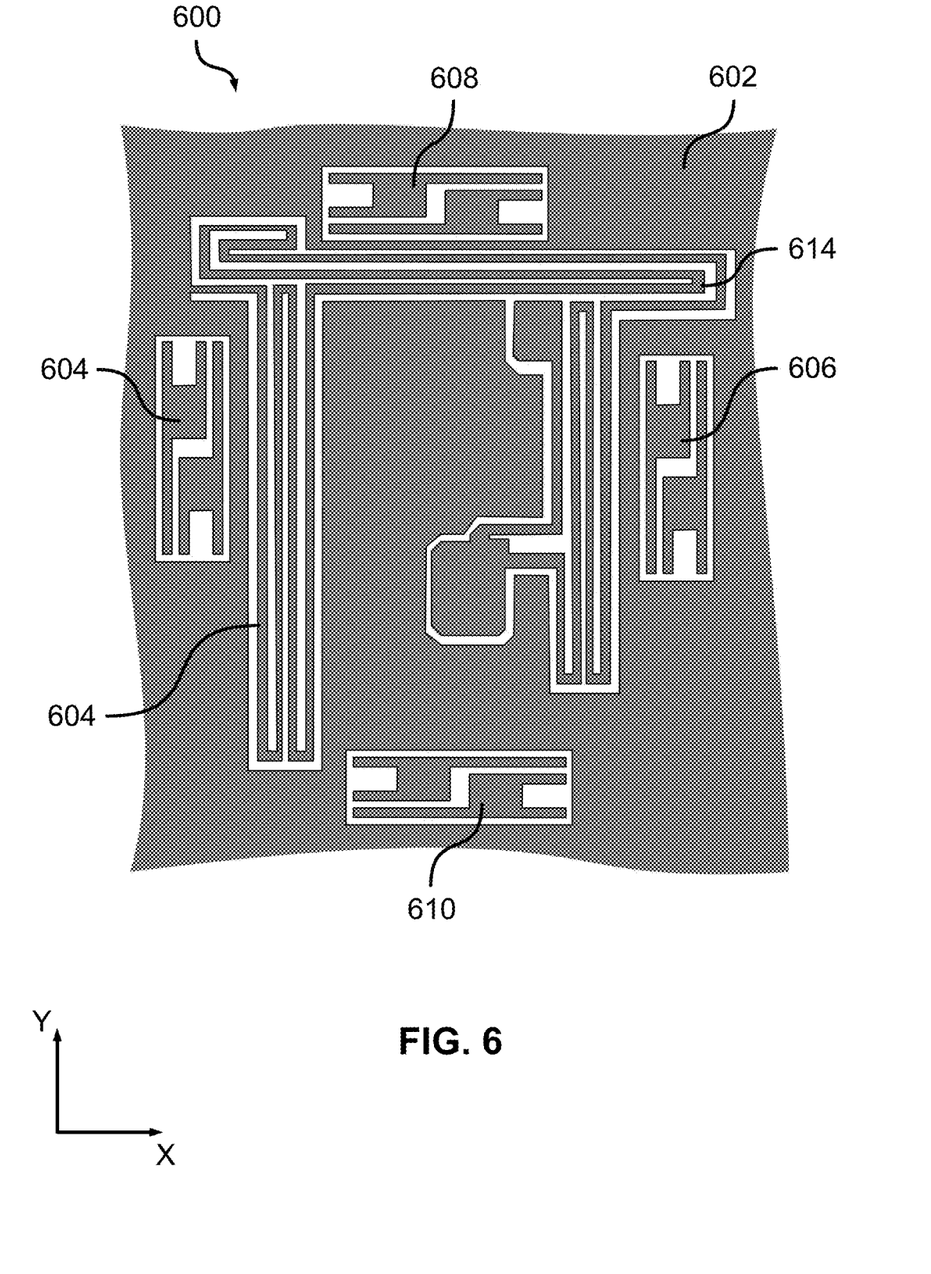
FIG. 6 is a plan view of a MEMS accelerometer according to some embodiments.

FIG. 6 is a plan view of a MEMS accelerometer 600 according to some embodiments of the present invention. The MEMS accelerometer 600 is formed on a substrate 602 (e.g., within a structural layer formed above the substrate 602), and includes four transducers 604, 606, 608, and 610, each of which is similar to the transducer 100 described above. The transducers (or more particularly, the movable structures thereof) are coupled to various spring members, such as translatory springs 612 and 614, in a manner similar to that described above. As will be apparent to one skilled in the art, transducers 604 and 606 are configured (and/or arranged) to detect acceleration along a first axis (e.g., the x-axis), while transducers 608 and 610 are configured to detect acceleration along a second axis (e.g., the y-axis). As such, the transducers described herein may be utilized in MEMS accelerometers capable of detecting acceleration in multiple axes, while still providing the benefits described herein.

Figure 7:
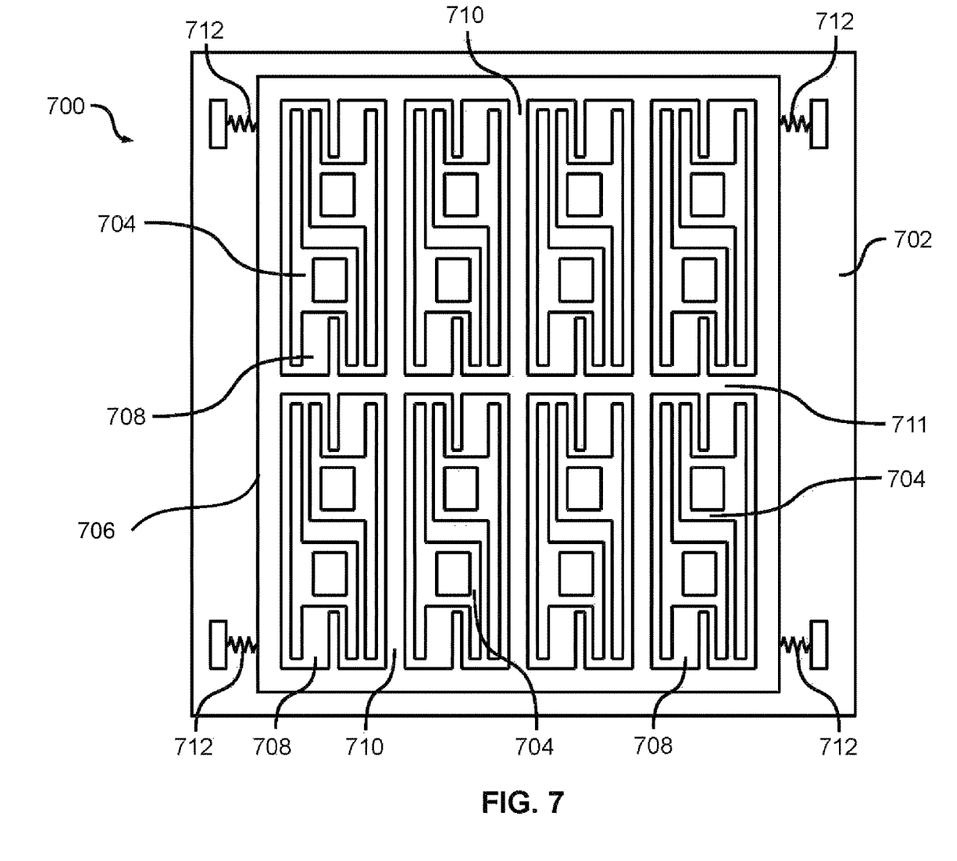
FIG. 7 is a schematic view of a MEMS device according to some embodiments.

FIG. 7 is a simplified schematic view of a MEMS accelerometer transducer 700 according to other embodiments. The transducer 700 is formed on (or above) a substrate 702, similar to that described above. The transducer 700 includes multiple anchored structure groups (or pairs) 704, each of which may include a first and a second anchored structure similar to the transducer 100 described above. The transducer 700 also includes a movable structure 706 (e.g., a single movable structure) which may be considered to be movable structure 108 described above "replicated" multiple times, once for each of the anchored structure groups 704. As such, the movable structure 706 includes an opening 708 for each of the anchored structure groups 704 and is positioned such that each of the anchored structure groups 704 is positioned within a respective one of the openings 708 (i.e., each of the anchored structure groups 704 is laterally surrounded by the movable structure 706). The openings 708 of the movable structure 706 are divided and/or formed by various movable structure beams 710, each of which extends across the entire length or width of the movable structure 706. The movable structure 706 is resiliently fixed to the substrate 702 via translatory springs 712, in a manner similar to that described above.

Embodiments such as the one shown in FIG. 7 may combine the improved sensitivity described above, along with improved structural rigidity and increases seismic mass due to the beams 710. The improvement in structural rigidity may be the result of at least some of the beams 710, such as beam 711, extending across the middle of the movable structure 706. Such a design may be useful for maximizing capacitive sensitivity given a particular available area on a substrate without sacrificing mechanical strength.

In one embodiment, a MEMS device is provided. The MEMS device includes a substrate, an anchored structure fixedly coupled to the substrate, and a movable structure resiliently coupled to the substrate. The movable structure has an opening formed therethrough and is positioned such that the anchored structure is at least partially within the opening and is in a capacitor-forming relationship with the movable structure. The movable structure comprises a movable structure finger extending only partially across the opening.

In another embodiment, a MEMS device is provided. The MEMS device includes a substrate, a first anchored structure fixedly coupled to the substrate and including a first anchored structure finger, a second anchored structure fixedly coupled to the substrate and including a second anchored structure finger, and a movable structure resiliently coupled to the substrate. The movable structure has an opening formed therethrough and is positioned such that the first anchored structure and the second anchored structure are at least partially within the opening and are laterally surrounded by the movable structure. The movable structure includes a first movable structure finger extending only partially across the opening and in a capacitor-forming relationship with the first anchored structure finger and a second movable structure finger extending only partially across the opening and in a capacitor-forming relationship with the second anchored structure finger.

In another embodiment, a method for determining a force with a MEMS device is provided. A change in capacitance between an anchored structure fixedly coupled to a substrate and a finger of a movable structure resiliently coupled to the substrate is detected. The movable structure has an opening and is positioned such that the anchored structure is at least partially within the opening. The finger of the movable structure extends only partially across the opening. The force is determined based on the detected change in capacitance.

In a further embodiment, a method for forming a MEMS device is provided. A substrate is provided. An anchored structure fixedly coupled to the substrate is formed. A movable structure resiliently coupled to the substrate is formed. The movable structure has an opening formed therethrough and is positioned such that the anchored structure is at least partially within the opening, is laterally surrounded by the movable structure, and is in a capacitor-forming relationship with the movable structure. The movable structure comprises a movable structure finger extending only partially across the opening.

For the sake of brevity, conventional techniques related to microelectromechanical systems (MEMS) fabrication and development, MEMS sensing, electrical connections, analog circuit design, and other functional aspects of the systems (and the individual operating components of the systems) may not be described in detail herein. It should be understood that any circuitry described or referred to above may be implemented either in silicon or another semiconductor material or alternatively by software code representation thereof, as will be appreciated by one skilled in the art.

The description above may refer to elements, nodes, or features/components as being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting, and the terms "first," "second" and other such numerical terms referring to structures do not imply a sequence or order unless clearly indicated by the context.

Although the preferred embodiments of the invention have been illustrated and described in detail, it will be readily apparent to those skilled in the art that various modifications may be made therein without departing from the spirit of the invention or from the scope of the appended claims. Accordingly, it should be appreciated that the exemplary embodiments are only examples, and are not intended to limit the scope, applicability, or configuration of the invention.

What is claimed is:

1. A microelectromechanical systems (MEMS) device comprising:
    a substrate;
    a first anchored structure fixedly coupled to the substrate;
    a second anchored structure fixedly coupled to the substrate; and
    a movable structure resiliently coupled to the substrate, the movable structure having an opening formed therethrough and being positioned such that the first anchored structure is at least partially within the opening and such that the second anchored structure is at least partially within the opening, and wherein the movable structure is in a capacitor-forming relationship with the first anchored structure and the second anchored structure, wherein the movable structure comprises a first movable structure finger extending only partially across the opening and a second movable structure finger extending only partially across the opening, and wherein the first movable structure finger is positioned to move away from the first anchored structure to decrease capacitance between the movable structure and the first anchored structure when the movable structure moves in a first direction, and wherein the second movable structure finger is positioned to move closer to the second anchored structure to increase capacitance between the movable structure and the second anchored structure when the movable structure moves in the first direction, and wherein the movable structure comprises a first portion and a second portion, the second portion being on a side of the opening opposite the first portion, and wherein the first movable structure finger extends from the first portion, into the opening, and towards the second portion, and wherein the first anchored structure comprises a first anchored structure finger in a capacitor-forming relationship with the first movable structure finger, and wherein the first anchored structure finger extends from the first anchored structure towards the first portion of the movable structure, and wherein the movable structure further comprises a third portion and a fourth portion, the fourth portion being on a side of the opening opposite the third portion, and wherein the first anchored structure further comprises a second anchored structure finger in a capacitor-forming relationship with the third portion of the movable structure.

2. The MEMS device of claim 1, wherein the movable structure laterally surrounds the first anchored structure and the second anchored structure.

3. The MEMS device of claim 1, wherein the first movable structure finger is at least partially positioned between the first anchored structure finger and the second anchored structure finger.

4. The MEMS device of claim 3, wherein a ratio of a distance between the first movable structure finger and the first anchored structure finger and a distance between the first movable structure finger and the second anchored structure finger is between about 1:2 and about 1:4.

5. The MEMS device of claim 4, wherein the distance between the first movable structure finger and the first anchored structure finger is between about 1 micrometer (μm) and about 5 μm.

6. A microelectromechanical systems (MEMS) device comprising:
    a substrate;
    a first anchored structure fixedly coupled to the substrate and comprising a first anchored structure finger;
    a second anchored structure fixedly coupled to the substrate and comprising a second anchored structure finger; and
    a movable structure resiliently coupled to the substrate, the movable structure having an opening formed therethrough and being positioned such that the first anchored structure and the second anchored structure are at least partially within the opening and are laterally surrounded by the movable structure, wherein the movable structure comprises:
        a first movable structure finger extending only partially across the opening and being in a capacitor-forming relationship with the first anchored structure finger; and
        a second movable structure finger extending only partially across the opening and being in a capacitor-forming relationship with the second anchored structure finger; and
    wherein the first movable structure finger is positioned to move away from the first anchored structure finger to decrease capacitance between the movable structure and the first anchored structure when the movable structure moves in a first direction, and wherein the second movable structure finger is positioned to move closer to the second anchored structure finger to increase capacitance between the movable structure and the second anchored structure when the movable structure moves in the first direction, and
    wherein the movable structure further comprises a first portion, a second portion, a third portion, and a fourth portion, the second portion being on a side of the opening opposite the first portion and the fourth portion being on a side of the opening opposite the third portion, and
    wherein the first movable structure finger extends from the first portion of the movable structure, into the opening, and towards the second portion, and the second movable structure finger extends from the second portion of the movable structure, into the opening, and towards the first portion,
    wherein the first anchored structure further comprises a third anchored structure finger, the third anchored structure finger being in a capacitor-forming relationship with the third portion of the movable structure, and
    wherein the second anchored structure further comprises a fourth anchored structure finger, the fourth anchored structure finger being in a capacitor-forming relationship with the fourth portion of the movable structure.

7. The MEMS device of claim 6, wherein the first movable structure finger is at least partially positioned between the first anchored structure finger and the third anchored structure finger, and
    wherein the second movable structure finger is at least partially positioned between the second anchored structure finger and the fourth anchored structure finger.

8. The MEMS device of claim 7, wherein a ratio of a distance between the first movable structure finger and the first anchored structure finger and a distance between the first movable structure finger and the third anchored structure finger is between about 1:2 and about 1:4, and wherein a ratio of the distance between the second movable structure finger and the second anchored structure finger and the distance between the second movable structure finger and the fourth anchored structure finger is between about 1:2 and about 1:4.

9. A method for determining a force with a microelectromechanical (MEMS) system device, the method comprising:
    detecting a first change in capacitance between a first anchored structure fixedly coupled to a substrate and a first finger of a movable structure resiliently coupled to the substrate, the movable structure having an opening and being positioned such that the first anchored structure is at least partially within the opening, the first finger of the movable structure extending only partially across the opening, where the first finger of the movable structure is positioned to move away from the first anchored structure to decrease capacitance between the movable structure and the first anchored structure when the movable structure moves in a first direction;
    detecting a second change in capacitance between a second anchored structure fixedly coupled to a substrate and a second finger of a movable structure resiliently coupled to the substrate, the movable structure having an opening and being positioned such that the second anchored structure is at least partially within the opening, the second finger of the movable structure extending only partially across the opening, where the second finger of the movable structure is positioned to move closer to the second anchored structure to increase capacitance between the movable structure and the second anchored structure when the movable structure moves in the first direction;
    determining a force based on the detected first change in capacitance and second change in capacitance;
    wherein the movable structure comprises a first portion and a second portion, the second portion being on a side of the opening opposite the first portion, and wherein the first finger extends from the first portion, into the opening, and towards the second portion, and wherein the first anchored structure comprises a third finger in a capacitor-forming relationship with the first finger; and
    wherein the movable structure further comprises a third portion and a fourth portion, the fourth portion being on a side of the opening opposite the third portion, and wherein the anchored structure further comprises a fourth finger in a capacitor-forming relationship with the third portion of the movable structure.

10. The method of claim 9, wherein the first finger is at least partially positioned between the third finger and the fourth finger.

11. The method of claim 10, wherein a ratio of a distance between the first finger and the third finger and a distance between the first finger and the fourth finger is between about 1:2 and about 1:4.

* * * * *